(12) United States Patent
Ding

(10) Patent No.: US 12,457,845 B2
(45) Date of Patent: Oct. 28, 2025

(54) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Ding Ding, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 579 days.

(21) Appl. No.: 17/614,507

(22) PCT Filed: Nov. 8, 2021

(86) PCT No.: PCT/CN2021/129347
§ 371 (c)(1),
(2) Date: Nov. 26, 2021

(87) PCT Pub. No.: WO2023/077517
PCT Pub. Date: May 11, 2023

(65) Prior Publication Data
US 2023/0146219 A1    May 11, 2023

(30) Foreign Application Priority Data
Nov. 2, 2021 (CN) .......................... 202111290420.4

(51) Int. Cl.
*H10K 50/844*     (2023.01)
*H10K 59/122*     (2023.01)
*H10K 59/131*     (2023.01)

(52) U.S. Cl.
CPC ......... *H10K 50/844* (2023.02); *H10K 59/122* (2023.02); *H10K 59/131* (2023.02)

(58) Field of Classification Search
CPC .. H10K 50/844; H10K 59/131; H10K 59/122; H10K 59/124
(Continued)

(56) References Cited

U.S. PATENT DOCUMENTS

2016/0260928 A1    9/2016    Choi et al.
2018/0061910 A1*   3/2018    Cai ...................... H10K 59/123
(Continued)

FOREIGN PATENT DOCUMENTS

CN    107068715 A    8/2017
CN    108962947 A    12/2018
(Continued)

OTHER PUBLICATIONS

Translation for CN 110993814 A, "Display Device And Preparation Method Thereof" by Du, Yan-ying (Year: 2020).*
(Continued)

*Primary Examiner* — Jacob Y Choi
*Assistant Examiner* — Ashley Nicole Blackwell
(74) *Attorney, Agent, or Firm* — PV IP PC; Christopher S. Ruprecht; Wei Te Chung

(57) ABSTRACT

A display device includes a display region and a non-display region. The display device includes a substrate; a non-organic insulation layer disposed on a side of the substrate; wherein a first groove is defined in the non-organic insulation layer corresponding to the non-display region, an opening of the first groove is away from the substrate, and a metal retaining wall is disposed in the first groove; a light-emitting layer disposed on a side of the non-organic insulation layer away from the substrate; and an encapsulation layer disposed on a side of the light-emitting layer away from the
(Continued)

substrate and extending from the display region to the non-display region. Wherein, the encapsulation layer is overlapped with the first groove in the non-display region, and a first gap is between an edge of the encapsulation layer and an edge of the non-organic insulation layer.

18 Claims, 11 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2018/0123060 | A1* | 5/2018 | Jang | H10K 59/131 |
| 2020/0381653 | A1* | 12/2020 | Bang | H10K 50/844 |
| 2021/0020714 | A1* | 1/2021 | Lee | H10K 59/124 |
| 2021/0234117 | A1* | 7/2021 | Liang | H10K 59/122 |
| 2022/0115474 | A1* | 4/2022 | Jia | H10K 50/813 |
| 2022/0140043 | A1* | 5/2022 | Cao | H01L 27/1255 |
| | | | | 257/43 |

FOREIGN PATENT DOCUMENTS

| | | | | |
|---|---|---|---|---|
| CN | 110943108 | A | | 3/2020 |
| CN | 110993814 | A * | 4/2020 | ........... H10K 59/874 |
| CN | 110993818 | A | | 4/2020 |
| CN | 111192974 | A | | 5/2020 |
| CN | 112366225 | A | | 2/2021 |
| WO | 2020150895 | A1 | | 7/2020 |

OTHER PUBLICATIONS

International Search Report in International application No. PCT/CN2021/129347, mailed on Jun. 23, 2022.
Written Opinion of the International Search Authority in International application No. PCT/CN2021/129347, mailed on Jun. 23, 2022.
Chinese Office Action issued in corresponding Chinese Patent Application No. 202111290420.4 dated Nov. 15, 2023, pp. 1-7.

* cited by examiner

DISPLAY DEVICE

BACKGROUND OF INVENTION

Field of Invention

The present application relates to a field of display technology, and particularly to a display device.

Description of Prior Art

Self-luminescence of organic light-emitting diodes is used in organic light-emitting display devices to realize display, the organic light-emitting diodes have advantages of low power consumption, quick response, and large viewing angles. In order to improve product image quality and to reduce product power consumption, low-temperature polysilicon (LTPS) thin film transistors and metal oxide thin film transistors are integrated on a same backplate. Therefore, advantages of high mobility and fast charging speed for pixel capacitors of low-temperature polysilicon thin film transistors and an advantage of low leakage of thin film transistors of metal oxides can be obtained at the same time. However, the metal oxides of the thin film transistors are very sensitive to hydrogen. When the hydrogen invades into the metal oxides, device characteristics may be deteriorated, thereby affecting product quality. Therefore, it is necessary to reduce content of hydrogen in upper and lower layers of the metal oxide as much as possible during manufacture to prevent a film layer with high hydrogen content from directly contacting to a channel region of metal oxide devices. Therefore, silicon oxide layers adjacent to the upper and lower layers of the metal oxide are generally disposed. However, silicon oxide has a poor barrier ability to water and oxygen in the atmosphere, and water and oxygen can also affect properties of metal oxides.

In current active matrix organic light emitting diode (AMOLED) backplate designs, thin film encapsulation (TFE) technology is usually used. However, when inorganic insulation layers are cut, cracks can occur and extend to active regions, resulting in products being poor. Therefore, TFE layers are generally covered on 2nd cutting lines, but the TFE layers are designed to be away from the 2nd cutting line with a certain distance to reduce cutting cracks and risks of cracks extending. However, such a design can make moisture and oxygen easily invade into the metal oxides, i.e., moisture, oxygen, etc. can invade into the metal oxides along inorganic insulation layers made of silica, resulting in deterioration of characteristics of the thin film transistor devices, and leading to products being abnormal.

In current active matrix organic light-emitting transistor backplate designs, there is a technical problem that moisture, oxygen, etc. easily invade into metal oxides.

SUMMARY OF INVENTION

In order to solve the aforesaid technical problem, in the present application, a source/drain layer extending to a substrate is used to reduce influence of water and oxygen of environment on a metal oxide device of a thin film transistor and to prevent moisture and oxygen in the environment from diffusing into a display device, thereby improving stability of the display device.

In order to realize the aforesaid purpose, the present application provides a display device. A display region and a non-display region are defined on the display device. The display device includes a substrate; a non-organic insulation layer disposed on a side of the substrate; wherein a first groove is defined in the non-organic insulation layer corresponding to the non-display region, an opening of the first groove is away from the substrate, and a metal retaining wall is disposed in the first groove; a light-emitting layer disposed on a side of the non-organic insulation layer away from the substrate; and an encapsulation layer disposed on a side of the light-emitting layer away from the substrate and extending from the display region to the non-display region. Wherein, the encapsulation layer is overlapped with the first groove in the non-display region, and a first gap is between an edge of the encapsulation layer and an edge of the non-organic insulation layer.

In one embodiment of the present application, the display device further includes: a first metal layer disposed on the side of the non-organic insulation layer away from the substrate, the first metal layer includes a plurality of peripheral wirings disposed in the non-display region, and the metal retaining wall disposed in the first groove is electrically connected to at least one of the peripheral wirings.

In one embodiment of the present application, the metal retaining wall in the first groove is electrically connected to the peripheral wiring farthest from the display region.

In one embodiment of the present application, the display device further includes a driving circuit layer including a plurality of transistors disposed in the non-organic insulation layer, the first metal layer further includes source/drain wirings disposed in the display region, and the source/drain wirings are electrically connected to the corresponding transistors.

In one embodiment of the present application, the driving circuit layer includes: a first semiconductor layer; a first gate electrode layer disposed on the first semiconductor layer away from the substrate; a second gate electrode layer disposed on a side of the first gate electrode layer away from the substrate; a second semiconductor layer disposed on a side of the second gate electrode layer away from the substrate; a third gate electrode disposed on a side of the second semiconductor layer away from the substrate; a source/drain layer disposed on a side of the second gate electrode layer away from the substrate and is electrically connected to the first semiconductor layer and the second semiconductor layer respectively; the non-organic insulation layer includes: a buffer layer disposed on the side of the substrate, wherein the first semiconductor layer is disposed on a side of the buffer layer away from the substrate; a first gate insulation layer disposed between the semiconductor layer and the first gate electrode layer; a second gate insulation layer disposed between the first gate electrode layer and the second gate electrode layer; a third gate insulation layer disposed between the second gate electrode layer and the second semiconductor layer; a fourth gate insulation layer disposed between the second semiconductor layer and the third gate electrode layer; and the interlayer insulation layer disposed between the third gate electrode layer and the source/drain layer, wherein the first groove extends from the interlayer insulation layer to the second gate insulation layer.

In one embodiment of the present application, the third gate insulation layer further includes a first interlayer insulation film layer and a second interlayer insulation film layer, the first interlayer insulation film layer is disposed on the second gate insulation layer, and the second interlayer insulation film layer is disposed between the first interlayer insulation film layer and the fourth gate insulation layer.

In one embodiment of the present application, the display device further includes: a planarization layer disposed on a side of the first metal layer away from the substrate, wherein the planarization layer is disposed in the display region and extends to the non-display region, a second gap is between an edge of the planarization layer and the edge of the non-organic insulation layer, and the second gap is greater than the first gap.

In one embodiment of the present application, the display device further includes a second metal layer disposed on a side of the planarization layer away from the substrate, wherein the second metal layer includes an anode disposed in the display region and a bridge wiring disposed in the non-display region, and the bridge wiring is electrically connected to the metal retaining wall.

In one embodiment of the present application, the display device further includes a cathode disposed on the side of the light-emitting layer away from the substrate, wherein the cathode is electrically connected to the bridge wiring in the non-display region.

In one embodiment of the present application, the planarization layer includes a first planarization layer and a second planarization layer, the first planarization layer is disposed on the non-organic insulation layer, and the second planarization layer is disposed on the first planarization layer.

In one embodiment of the present application, a second groove is defined in the non-display region and is located in the first planarization layer, and a part of the second metal layer is filled in the second groove and is connected to the first metal layer.

In one embodiment of the present application, a plurality of third grooves are defined in the second planarization layer, and the anode is disposed on the planarization layer, is filled in the third grooves, and is connected to the second metal layer.

In one embodiment of the present application, a fourth groove extends from the interlayer insulation layer to the second semiconductor layer, and the first metal layer is filled in the fourth groove and is connected to the second semiconductor layer.

In one embodiment of the present application, the display device further includes a pixel definition layer, and the pixel definition layer is disposed on the anode.

In one embodiment of the present application, a sixth groove is defined in the pixel definition layer, the light-emitting layer is filled in the sixth groove, and the cathode covers the light-emitting layer.

In one embodiment of the present application, the substrate includes a first substrate layer, a first barrier layer, a second substrate layer, and a second barrier layer, the first barrier layer is disposed on the first substrate layer, the second substrate layer is disposed on the first barrier layer, and the second barrier layer is disposed on the second substrate layer.

In one embodiment of the present application, a seventh groove extends from the interlayer insulation layer to the second substrate layer, and a part of the first planarization layer is filled in the seventh groove.

In one embodiment of the present application, the first metal layer includes a first source/drain layer and a second source/drain layer, and the second source/drain layer is disposed on the first source/drain layer and is electrically connected to the first source/drain layer.

In one embodiment of the present application, the first source/drain layer and the second source/drain layer include a plurality of source/drain film layers.

In one embodiment of the present application, the first groove is defined around the display region.

In the present application, the source/drain layer extending to a substrate can reduce influence of water and oxygen of environment on a metal oxide device of a thin film transistor. Therefore, moisture and oxygen in the environment diffusing into a display device is prevented, thereby having a beneficial effect of improving the stability of the display device.

DETAILED DESCRIPTION OF EMBODIMENTS

Figure 1:
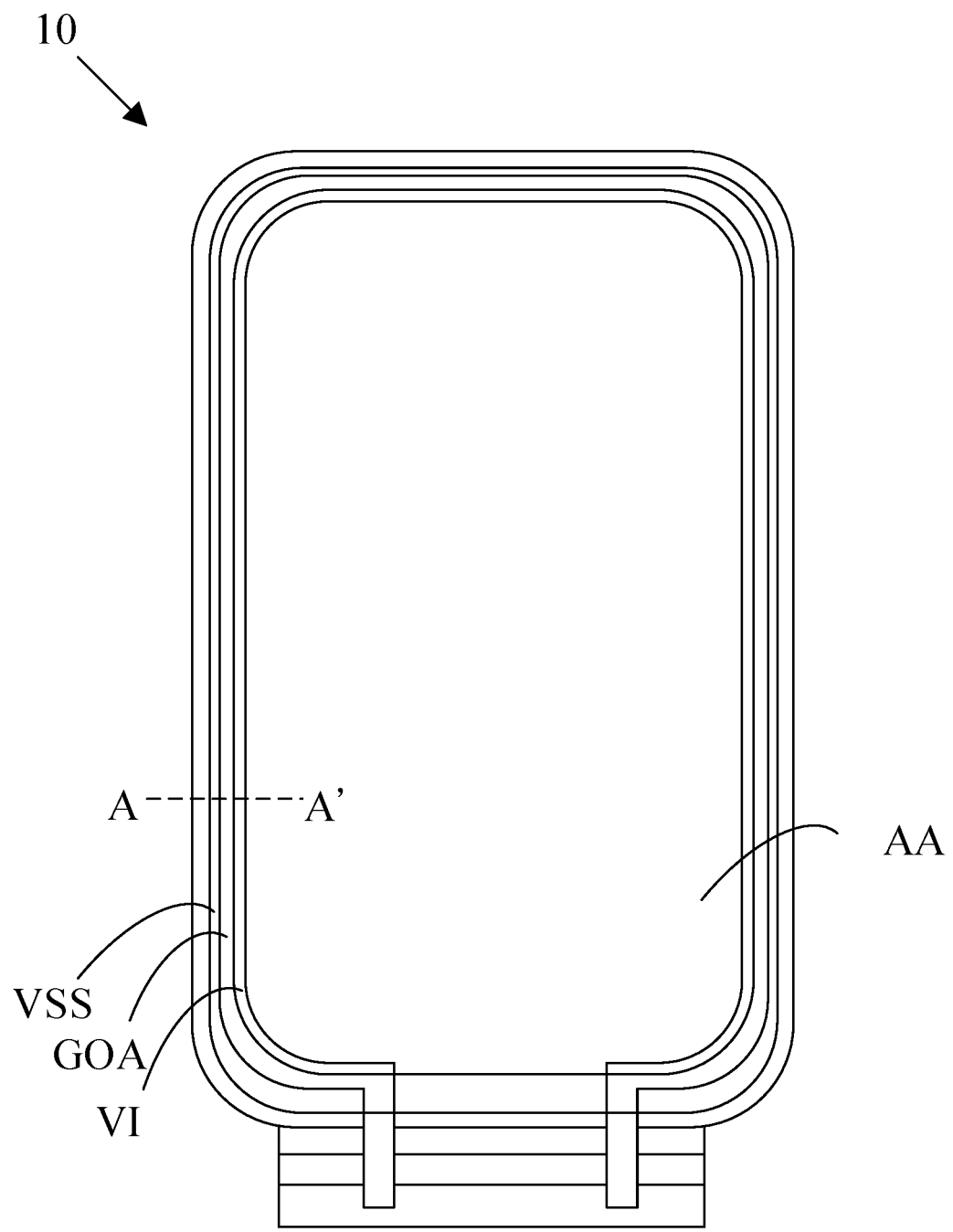
FIG. 1 is a top view of a display device of the present application.

In order to allow the above and other purposes, features, and advantages of the present application to be more obvious and easier to understand, preferred embodiments of the present application will be particularly described hereinafter, and with reference to the accompanying drawings, a detailed description will be given below. Moreover, the directional terms of which the present application mentions, for example, "upper", "lower", "top", "bottom", "front", "rear", "left", "right", "inside", "outside", "side", "circumference", "center", "horizontal", "vertical", "axial", "radial", "top layer", "bottom layer", etc., only refer to directions of the accompanying figures. Therefore, the used directional terms are for illustrating and understanding the present application, but not for limiting the present application.

In the figures, units with similar structures are indicated by the same reference numerals.

As illustrated in FIG. 1 to FIG. 9, a display device 10 is provided by the present application. A display region AA and a non-display region are defined in the display device 10. The display region AA is a region where a cathode 500 is disposed. The non-display region includes a first wiring region VSS, a second wiring region GOA, and a third wiring region VI. The display region AA is the region where the cathode 500 is disposed. A cathode signal is provided by the first wiring region VSS. A second wiring region GOA is region where a driving circuit is disposed. The third wiring region VI is a region where a reset wiring is disposed.

The display device 10 includes a substrate, an inorganic insulation layer, a pixel definition layer 300, a light-emitting layer 400, and an encapsulation layer. The display device 10 can be a mobile phone screen, a computer screen, etc. with a display function. The outermost edge of the display device 10 in FIG. 1 can be a 2nd cutting line. FIG. 2 to FIG. 9 are sectional views of FIG. 1 along a dashed line AA'.

Furthermore, as illustrated in FIG. 2 to FIG. 9, the substrate can include a first substrate layer 101, a first barrier layer 102, a second substrate layer 103, and a second barrier layer 104. The first barrier layer 102 is disposed on the first substrate layer 101. The second substrate layer 103 is disposed on the first barrier layer 102. The second barrier layer 104 is disposed on the second substrate layer 103. In one embodiment, the first substrate layer 101 and the second substrate 103 can be flexible substrates. Specifically, the first substrate layer 101 and the second substrate layer 103 can be made of polyimide.

The non-organic insulation layer can be disposed on a side of the substrate. In the non-organic insulation layer, a first groove 201 is defined corresponding to the non-display region. An opening of the first groove 201 is away from the substrate. A metal retaining wall is filled in the first groove 201 to block moisture, oxygen, etc.

In one embodiment, the first groove 201 can defined around the display region AA. The first wiring region VSS is provided with a low level line 126, and the low level line 126 is electrically with the metal retaining wall. For example, it can be understood that the first groove 201 can be disposed in the second wiring region GOA and surrounds the display region AA along the second wiring region GOA from FIG. 1 to FIG. 2, so that moisture can be prevented from invading into the display device 10 from a direction of the substrate.

The light-emitting layer 400 can be disposed on a side of the non-organic insulation layer away from the substrate. In one embodiment, the light-emitting layer 400 can include a plurality of organic light-emitting transistors.

An encapsulation layer can be disposed on a side of the light-emitting layer 400 away from the substrate and extending from the display region AA to the non-display region. In one embodiment, the display device 10 of the present application is encapsulated by a thin-film encapsulation technology, and the encapsulation layer includes a first encapsulation layer 601 and a second encapsulation layer 602. In addition, the encapsulation layer is overlapped with the first groove 201 in the non-display region, and a first gap is between an edge of the encapsulation layer and an edge of the non-organic insulation layer.

Furthermore, the first gap corresponds to a position of the 2nd cutting line. Therefore, disposing the metal retaining wall in the first groove 201 corresponding to the first gap can prevent moisture and oxygen from easily invading into the metal oxides, i.e., preventing moisture, oxygen, etc. from invading into the metal oxides along inorganic insulation layers made of silica, causing deterioration of characteristics of the thin film transistor devices, and leading to products being abnormal.

In one embodiment, the display device 10 further includes a first metal layer. The first metal layer is disposed on the side of the non-organic insulation layer away from the substrate. As illustrated in FIG. 2 to FIG. 9, the first metal layer includes a plurality of peripheral wirings 127 disposed in the non-display region, for example, source/drain wirings, etc., and the metal retaining wall disposed in the first groove 201 is electrically connected to at least one of the peripheral wirings 127. The peripheral wirings 127 may include the source/drain wirings, but do not include the low level line 126.

Furthermore, the metal retaining wall in the first groove 201 is electrically connected to the peripheral wiring farthest from the display region AA. As illustrated in FIG. 2 to FIG. 9, the metal retaining wall filled in the first groove 201 is electrically connected to the peripheral wirings of the first metal layer.

In one embodiment, the display device 10 further includes a driving circuit. The driving circuit layer includes a plurality of transistors disposed in the non-organic insulation layer, and the thin film transistors can be thin film transistors. The first metal layer further includes source/drain wirings disposed in the display region, and the source/drain wirings are electrically connected to the corresponding transistors. In addition, the source/drain wirings can be made of the metal retaining wall filled in the first groove 201.

Furthermore, the driving circuit layer includes a first semiconductor layer 107; a first gate electrode layer 109 disposed on the semiconductor layer 107 away from the substrate; a second gate electrode layer 111 disposed on a side of the first gate electrode layer 109 away from the substrate; a second semiconductor layer 114 disposed on a side of the second gate electrode layer 111 away from the substrate; a third gate electrode 116 disposed on a side of the second semiconductor layer 114 away from the substrate; a source/drain layer disposed on a side of the second gate electrode layer 111 away from the substrate and is electrically connected to the first semiconductor layer 107 and the second semiconductor layer 114 respectively.

In one embodiment, the first semiconductor layer 107 includes amorphous silicon. In another embodiment, polycrystalline silicon can be formed in the first semiconductor layer 107 by a manner of excimer laser annealing to provide a semiconductor channel with high mobility for electrons and electron holes. In other words, the thin film transistor with the first semiconductor layer 107 can be a low temperature poly-silicon thin film transistor (LTPS TFT)

In one embodiment, the second semiconductor layer 114 can include indium gallium zinc oxide. In other words, the thin film transistor with the second semiconductor layer 114 can be an indium gallium zinc oxide thin film transistor (IGZO TFT). Using the IGZO TFT thin film transistor can reduce leakage current.

Furthermore, in one embodiment, as illustrated in FIG. 2 to FIG. 9, the first metal layer can include a first source/drain layer 119 and a second source/drain layer 120. The second source/drain layer 120 is disposed on the first source/drain layer 119 and is electrically connected to the first source/drain layer 119.

Figure 10:
FIG. 10 is a schematic diagram of a first metal layer of the present application.

In one embodiment, as illustrated in FIG. 10, the source/drain layer is a multilayer structure formed by a metal with high corrosion resistance and high acid resistance. Specifically, the first source/drain layer 119 can include a first source/drain film layer 1191, a second source/drain film layer 1192, and a third source/drain film layer 1193. Wherein, the first source/drain film layer 1191 and the third source/drain film layer 1193 can be made of titanium, and the second source/drain film layer 1192 can be made of aluminum, but are not limited thereto. The first source/drain layer 119 can also be a single-layer structure, or the first source/drain film layer 1191, the second source/drain film layer 1192, and the third source/drain film layer 1193 can be made of other materials according to requirements.

Figure 11:
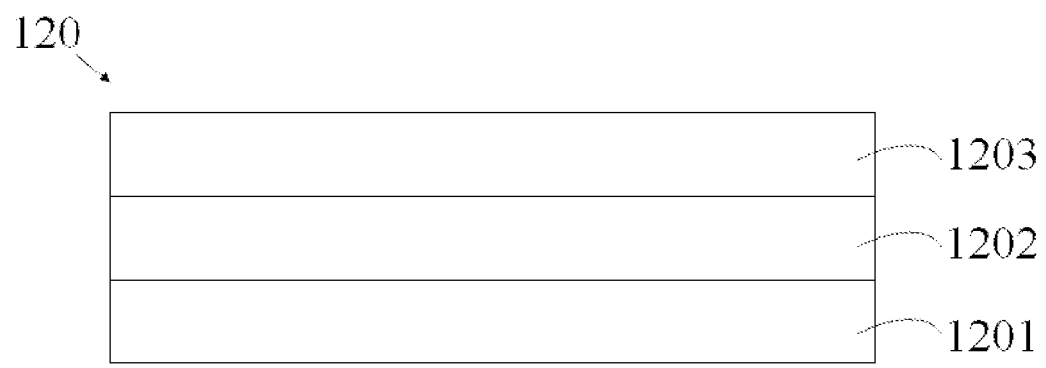
FIG. 11 is a schematic diagram of a second metal layer of the present application.

In another embodiment, as illustrated in FIG. 11, the second source/drain layer 120 can include a multilayer structure formed by a metal with high corrosion resistance and high acid resistance. Specifically, the second source/drain layer 120 can include a fourth source/drain film layer 1201, a fifth source/drain film layer 1202, and a sixth source/drain film layer 1203. Wherein, the fourth source/drain film layer 1201 and the sixth source/drain film layer 1203 can be made of titanium, and the fifth source/drain film layer 1202 can be made of aluminum, but are not limited thereto. The second source/drain layer 120 can also be a single-layer structure, or the fourth source/drain film layer 1201, the fifth source/drain film layer 1202, and the sixth source/drain film layer 1203 can be made of other materials according to requirements.

Furthermore, the aforesaid insulation layer includes: a buffer layer disposed on the side of the substrate, wherein the first semiconductor layer 107 is disposed on a side of the buffer layer away from the substrate; a first gate insulation layer 108 disposed between the semiconductor layer 107 and the first gate electrode layer 109; a second gate insulation layer 110 disposed between the first gate electrode layer 109 and the second gate electrode layer 111; a third gate insulation layer disposed between the second gate electrode layer 111 and the second semiconductor layer 114; a fourth gate insulation layer 115 disposed between the second semiconductor layer 114 and the third gate electrode layer 116; and the interlayer insulation layer 121 disposed between the third gate electrode layer 116 and the source/drain layer, wherein the first groove 201 extends from the interlayer insulation layer 121 to the second gate insulation layer 110.

Furthermore, the buffer layer is disposed on the substrate. In one embodiment, the buffer layer includes a first buffer film layer 105 and a second buffer film layer 106. The first buffer film layer 105 is disposed on the substrate, and the second buffer film layer 106 is disposed on the first buffer film layer 105. The first buffer film layer 105 includes silicon nitride, and the second buffer film layer includes silica. The semiconductor layer 107 is disposed on the buffer layer. A first gate insulation layer 108 is disposed on the buffer layer and covers the semiconductor layer 107. The first gate electrode layer 109 is disposed on the first gate insulation layer 108. The second gate insulation layer 110 is disposed on the first gate insulation layer 108.

Besides, the display device 10 further includes a planarization layer. The planarization layer is disposed on a side of the first metal layer away from the substrate. Furthermore, in one embodiment, the planarization layer can include a first planarization layer 117 and a second planarization layer 118. The first planarization layer 117 is disposed on the interlayer insulation layer 121, and the second planarization layer 118 is disposed on the first planarization layer 117. The planarization layer is disposed in the display region and extends to the non-display region. The planarization layer is formed with a dam 128 on the interlayer insulation layer 121 at an edge of the non-display region away from the display region. In particular, the dam 128 may be formed by the first planarization layer 117 and the second planarization layer 118 at the edge of the non-display region away from the display region. For example, the dam 128 may be formed in a form of a trapezoidal shape. A second gap is between an edge of the planarization layer and the edge of the non-organic insulation layer. The second gap is greater than the first gap.

Furthermore, the first metal layer can be disposed on the interlayer insulation layer 121 and is covered by the first planarization layer 117; the second metal layer can be disposed on the first planarization layer 117 and is covered by the second planarization layer 118; a second groove 202 can be defined in the non-display region and is located in the first planarization layer 117; and a part of the second metal layer can be filled in the second groove 202 and is connected to the first metal layer.

In one embodiment, the second metal layer is disposed on a side of the planarization layer away from the substrate, the second metal layer includes an anode 200 in the display region AA and a bridge wiring 210 disposed in the non-display region, and the bridge wiring 210 is electrically connected to the metal retaining wall. The anode 200 is disposed on the side of the planarization layer away from the substrate. The bridge wiring 210 in the non-display region is electrically connected to the metal retaining wall.

As illustrated in FIG. 2 to FIG. 9, the display device 10 further includes a pixel definition layer 300, a cathode 500, and a color film layer 700. The cathode 500 is disposed on a side of the light-emitting layer 400 away from the substrate. Specifically, the cathode 500 is disposed on the side of and an entire surface of the light-emitting layer 400 away from the substrate and is electrically connected to the bridge wiring 210 in the non-display region. Furthermore, in one embodiment, the bridge wiring 210 is a bridge wiring made of a metal in a same layer of the anode 200. The pixel definition layer 300 is disposed on the anode 200. The light-emitting layer 400 is disposed on the pixel definition layer 300.

In addition, as illustrated in FIG. 2 to FIG. 9, the anode 500 is disposed on the pixel definition layer 300 and covers the light-emitting layer 400. The encapsulation layer is disposed on the cathode 500 and covers the anode 200, the pixel definition layer 300, the light-emitting layer 400, and the cathode 500. Furthermore, in one embodiment, the color film layer 700 can be disposed between the first encapsulation layer 601 and the second encapsulation layer 602 by a inkjet printing manner.

In one embodiment, as illustrated in FIG. 2 to FIG. 6, the third gate insulation layer further includes a first interlayer insulation film layer 112 and a second interlayer insulation film layer 113. The first interlayer insulation film layer 112 is disposed on the second gate insulation layer 110. The second interlayer insulation film layer 113 is disposed between the first interlayer insulation film layer 112 and the fourth gate insulation layer 115. The first interlayer insulation film layer 112 includes silicon nitride. The second interlayer insulation film layer 113 includes silica.

Figure 2:
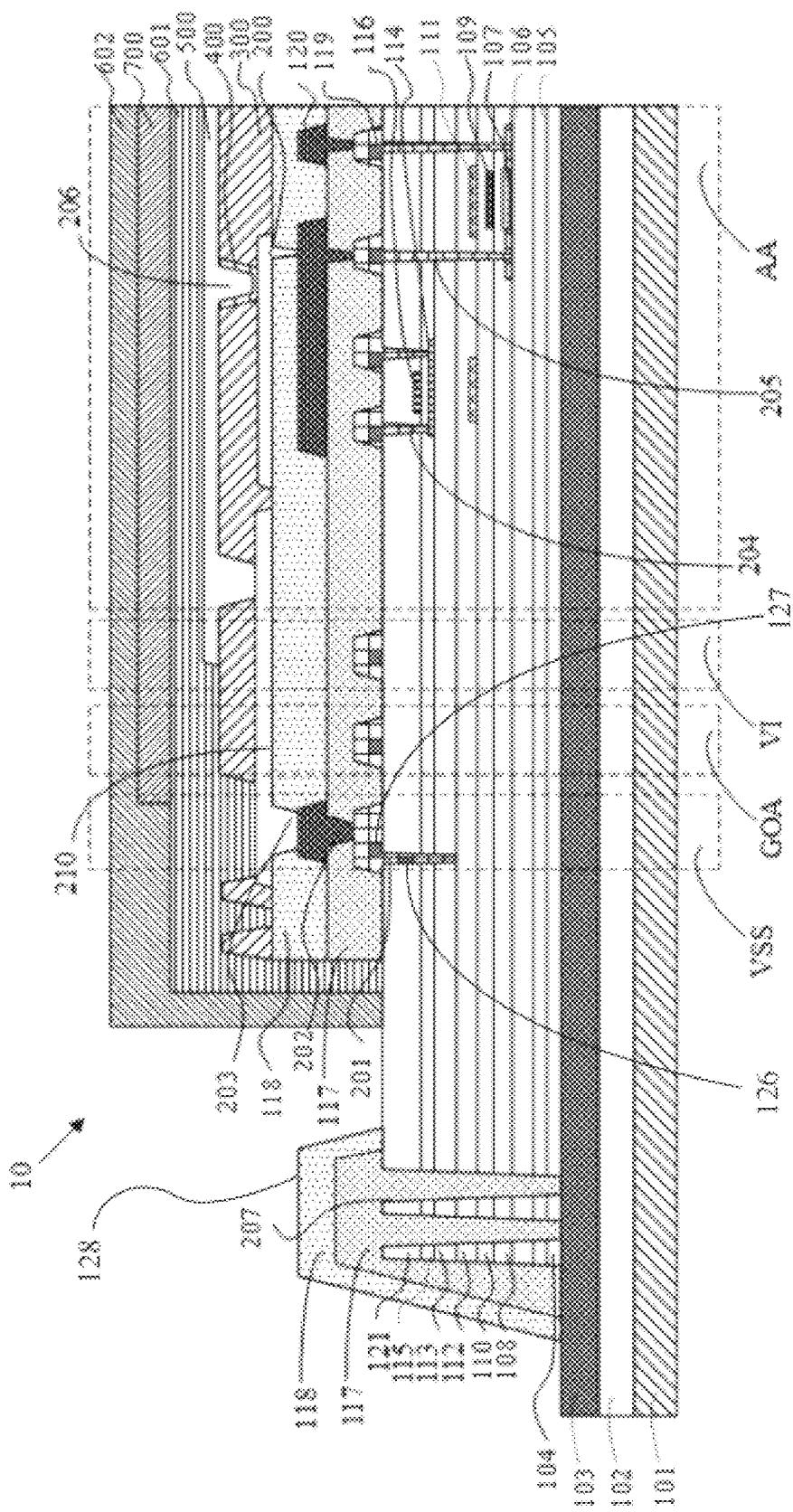
FIG. 2 is a first schematic diagram of the display device of the present application.

As illustrated in FIG. 2, in one embodiment, the first groove 201 extends from the interlayer insulation layer 121 to an upper surface of the second interlayer insulation film layer 113 to block moisture, hydrogen, oxygen, etc. diffusing from the direction of the substrate to the second semiconductor layer 114.

Figure 3:
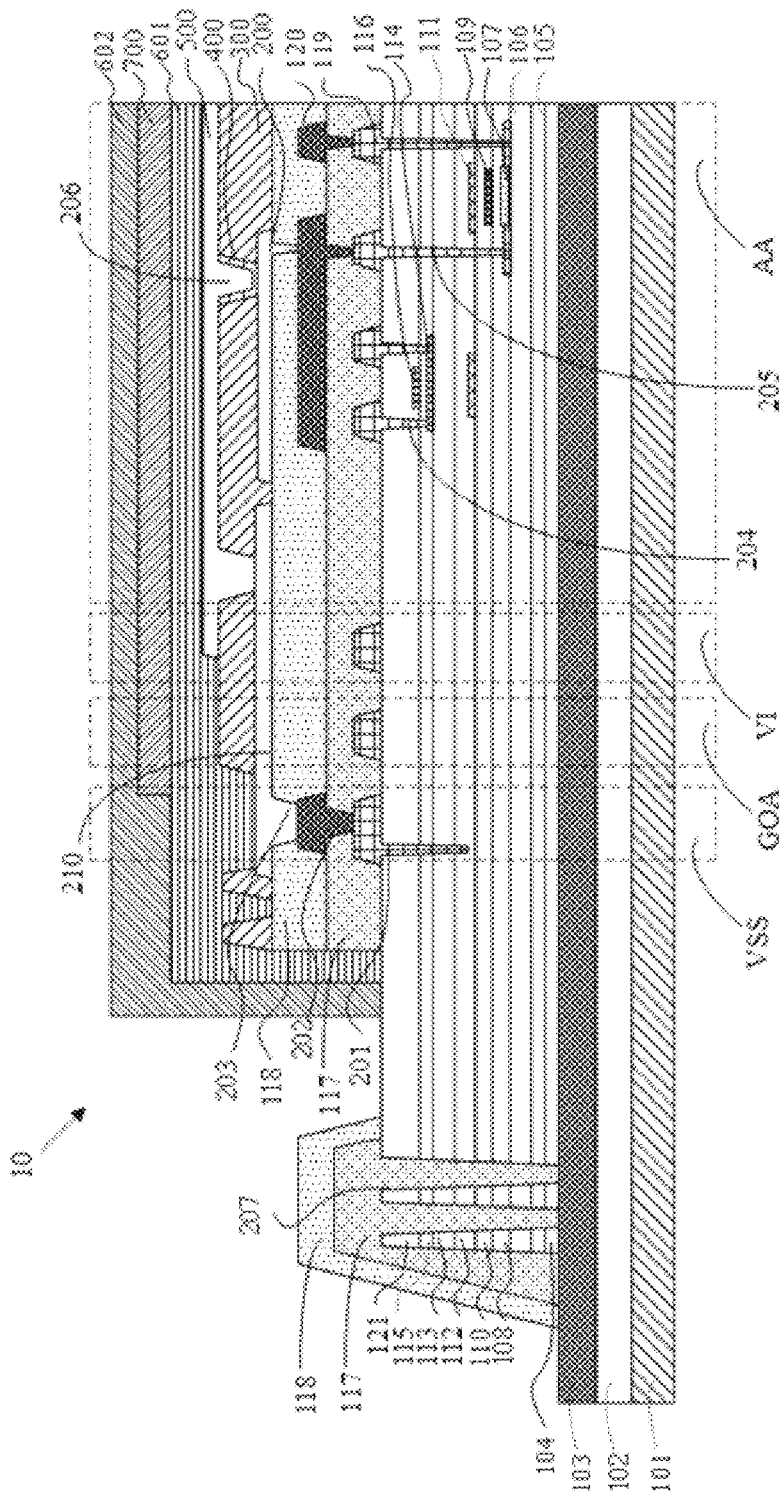
FIG. 3 is a second schematic diagram of the display device of the present application.

As illustrated in FIG. 3, in one embodiment, the first groove 201 extends from the interlayer insulation layer 121 to a position between the upper surface and a lower surface of the second interlayer insulation film layer 113 to block moisture, hydrogen, oxygen, etc. diffusing from the direction of the substrate to the second semiconductor layer 114.

Figure 4:
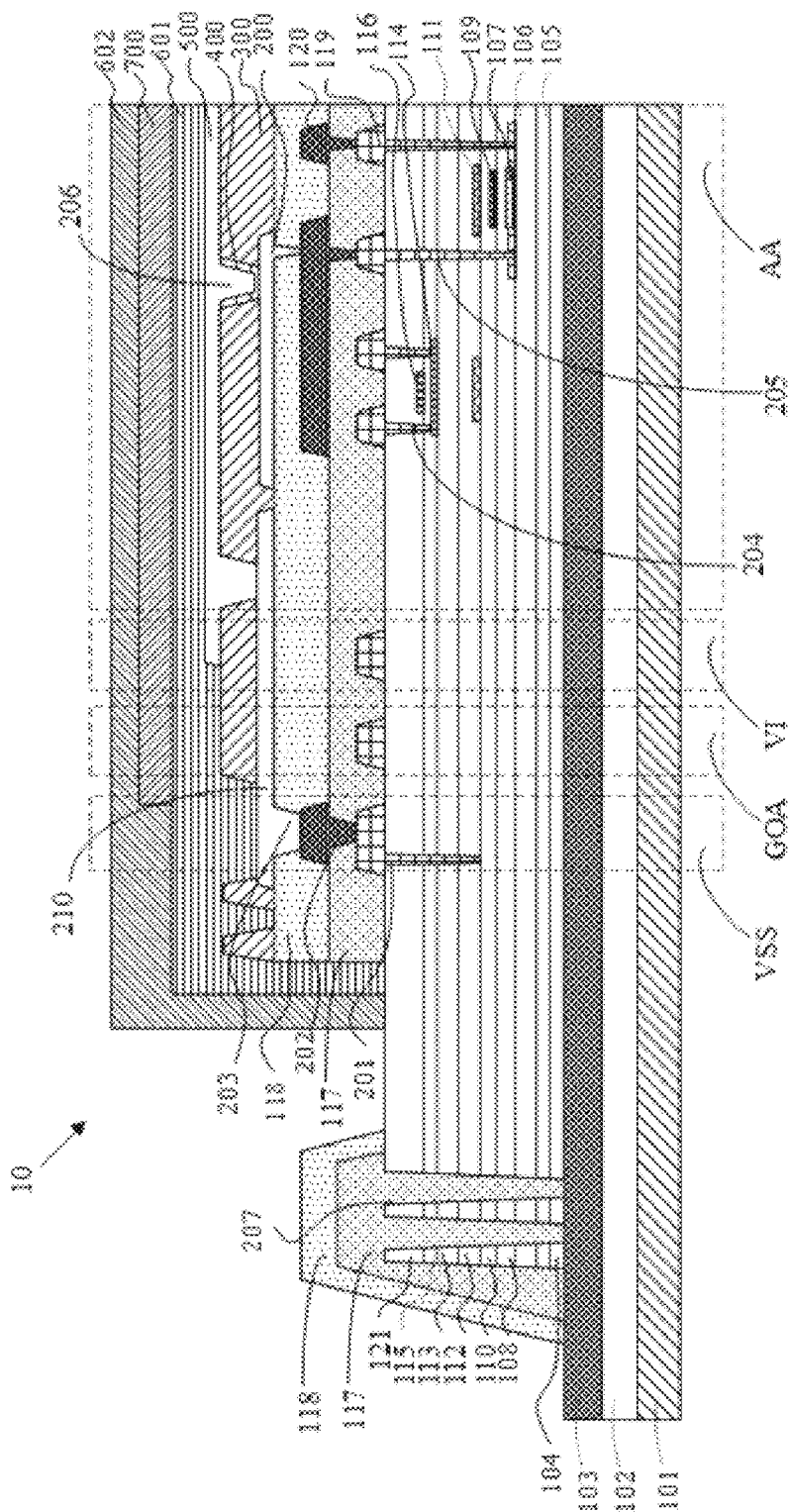
FIG. 4 is a third schematic diagram of the display device of the present application.

As illustrated in FIG. 4, in one embodiment, the first groove 201 extends from the interlayer insulation layer 121 to the lower surface of the second interlayer insulation film layer 113 to improve effect of blocking diffusion of moisture, hydrogen, oxygen, etc. from the direction of the substrate to the second semiconductor layer 114.

Figure 5:
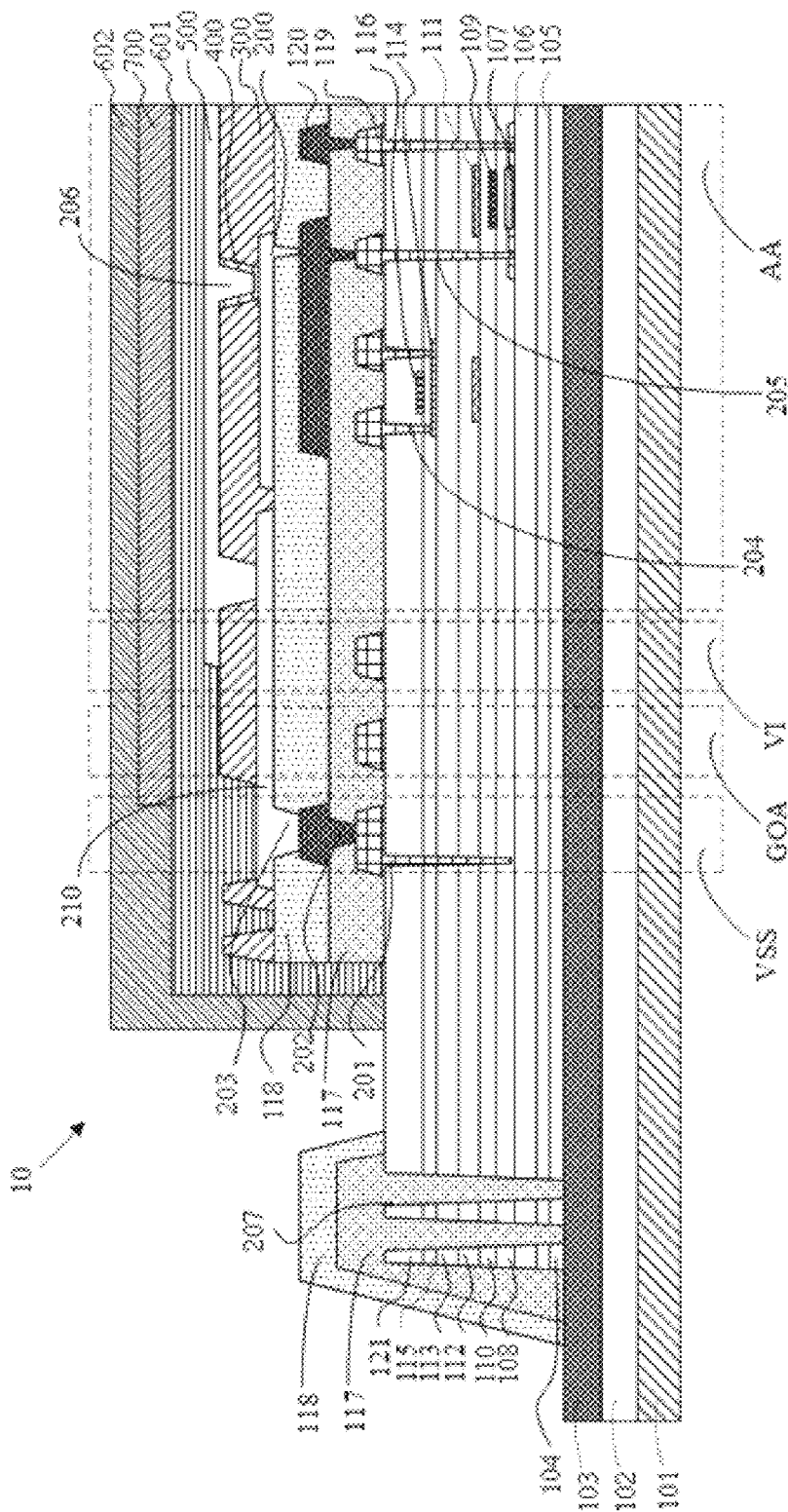
FIG. 5 is a fourth schematic diagram of the display device of the present application.

As illustrated in FIG. 5, in one embodiment, the first groove 201 extends to a first functional layer, which has the best effect of blocking diffusion of moisture, hydrogen, oxygen, etc. from the direction of the substrate to the second semiconductor layer 114.

In another embodiment, as illustrated in FIG. 6 to FIG. 9, the third gate insulation layer only includes one first interlayer insulation film layer 112. The first interlayer insulation film layer 112 only includes silica. Because a blocking ability for moisture, hydrogen, oxygen, etc. of silica is not as good as silicon nitride, in other words, the blocking ability of this structure for moisture, hydrogen, and oxygen is not as good as the embodiments of the third gate insulation layer including the first interlayer insulation film layer 112 the second interlayer insulation film layer 113. Therefore, as illustrated in FIG. 6 to FIG. 9, the first groove 201 at least extends from the interlayer insulation layer 121 to the second gate insulation layer 110.

Figure 6:
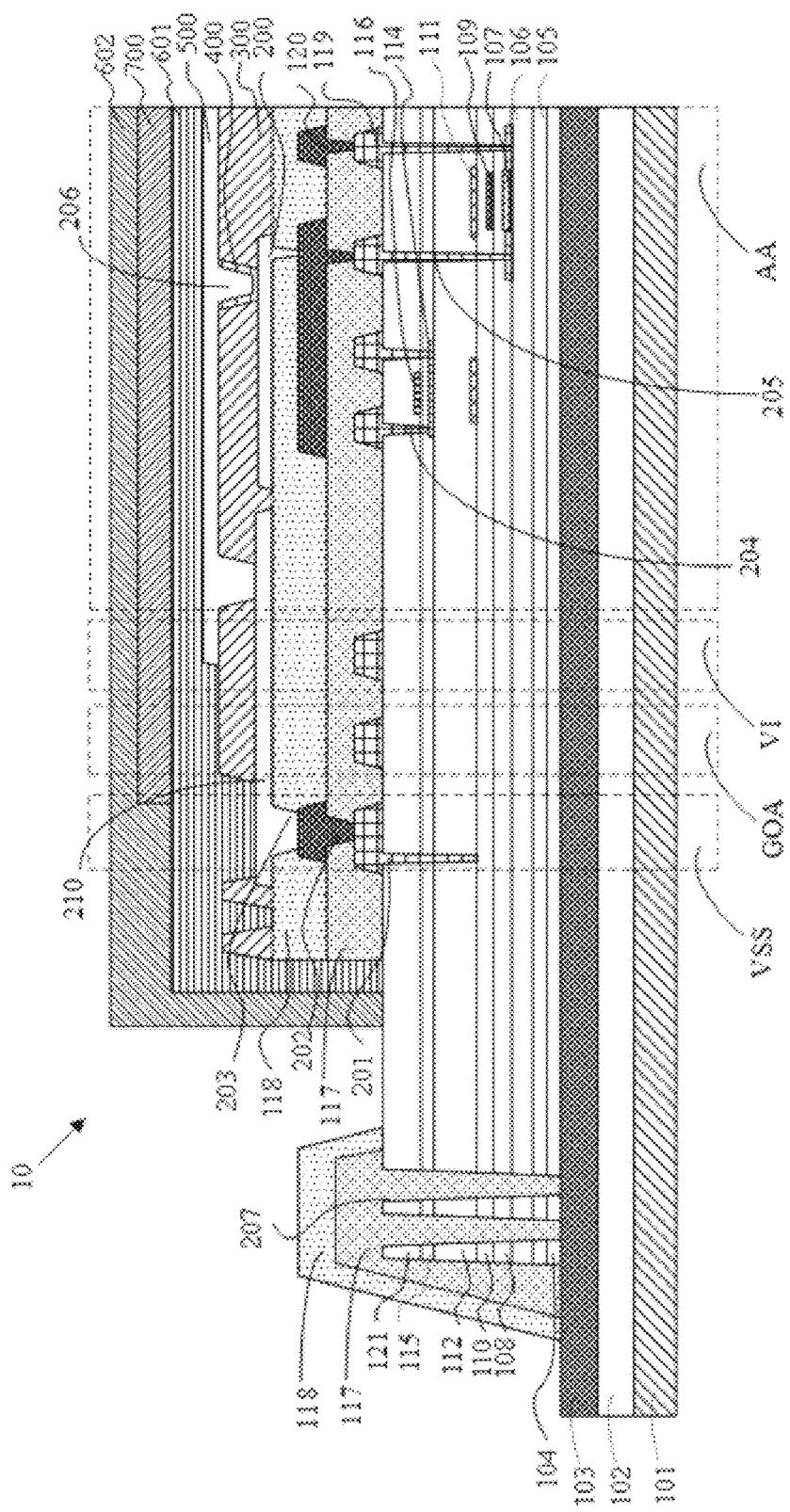
FIG. 6 is a fifth schematic diagram of the display device of the present application.

Specifically, in one embodiment, as illustrated in FIG. 6, the first groove 201 extends from the interlayer insulation layer 121 to an upper surface of the second gate insulation layer 110 to block moisture, hydrogen, oxygen, etc. diffusing from the direction of the substrate to the second semiconductor layer 114.

Figure 7:
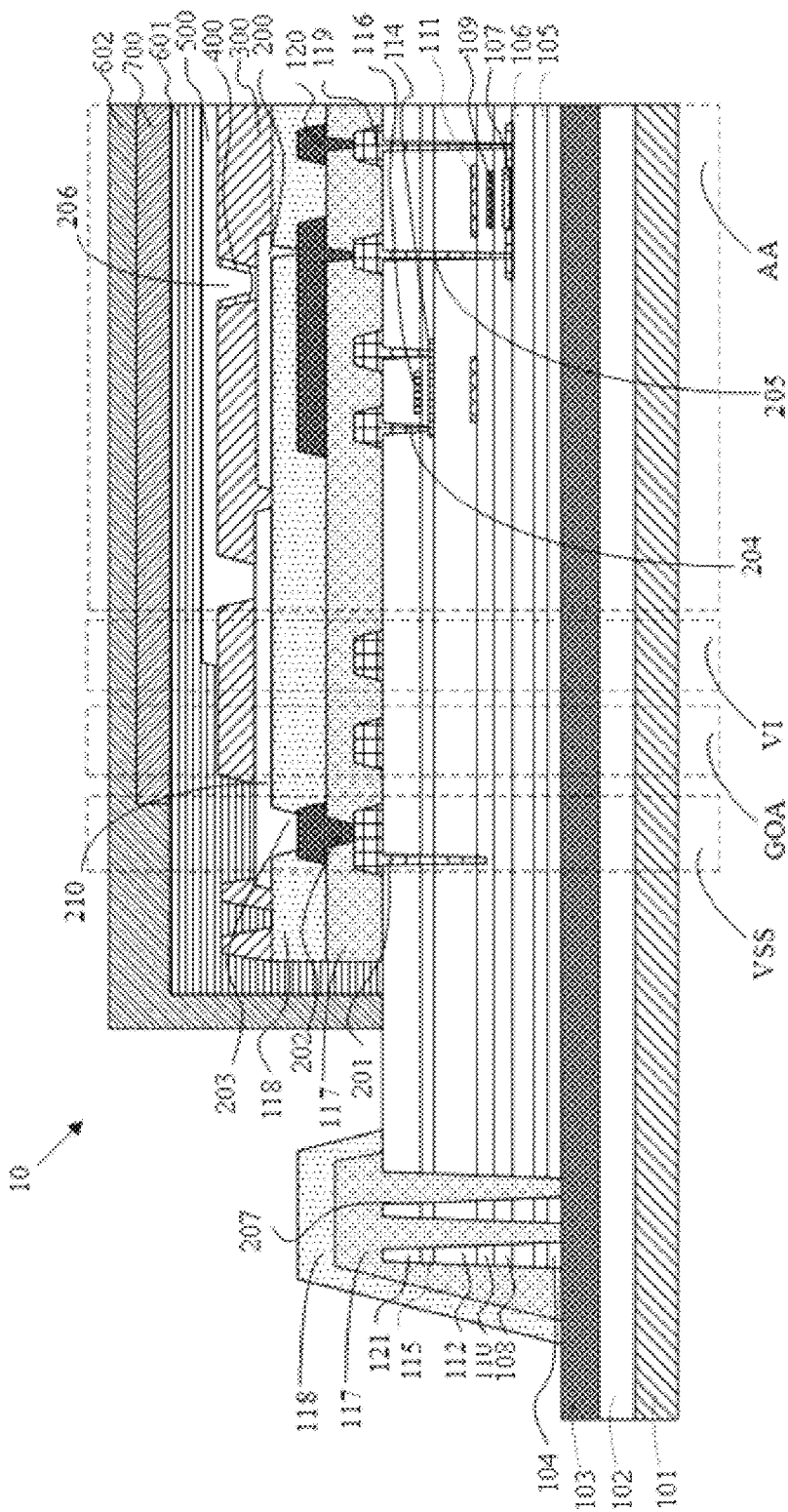
FIG. 7 is a sixth schematic diagram of the display device of the present application.

In one embodiment, as illustrated in FIG. 7, the first groove 201 extends from the interlayer insulation layer 121 to a position between the upper surface and a lower surface of the second gate insulation layer 110 to block moisture, hydrogen, oxygen, etc. diffusing from the direction of the substrate to the second semiconductor layer 114.

Figure 8:
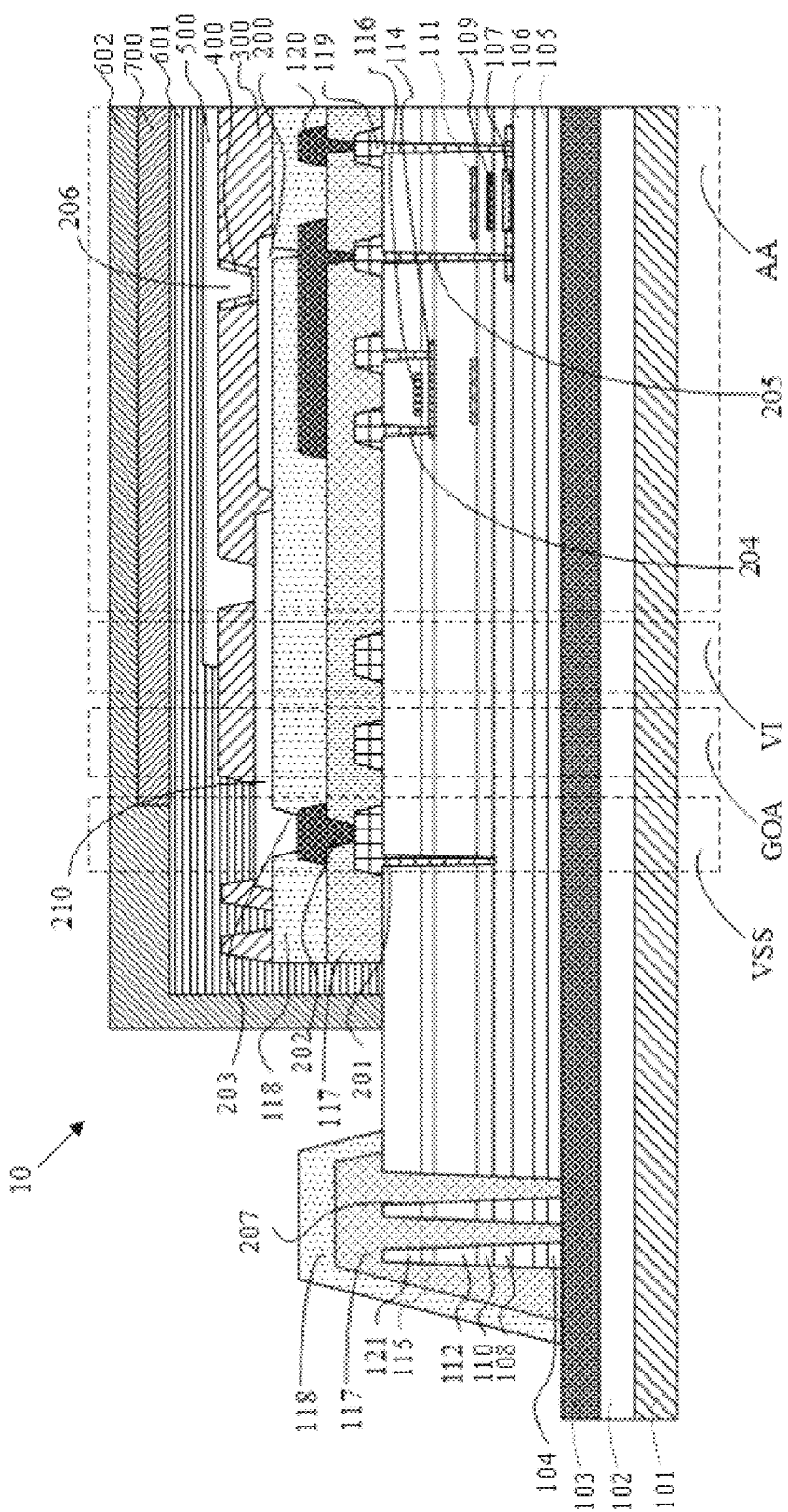
FIG. 8 is a seventh schematic diagram of the display device of the present application.

In one embodiment, as illustrated in FIG. 8, the first groove 201 extends from the interlayer insulation layer 121 to the lower surface of the second gate insulation layer 110 to block moisture, hydrogen, oxygen, etc. diffusing from the direction of the substrate to the second semiconductor layer 114.

Figure 9:
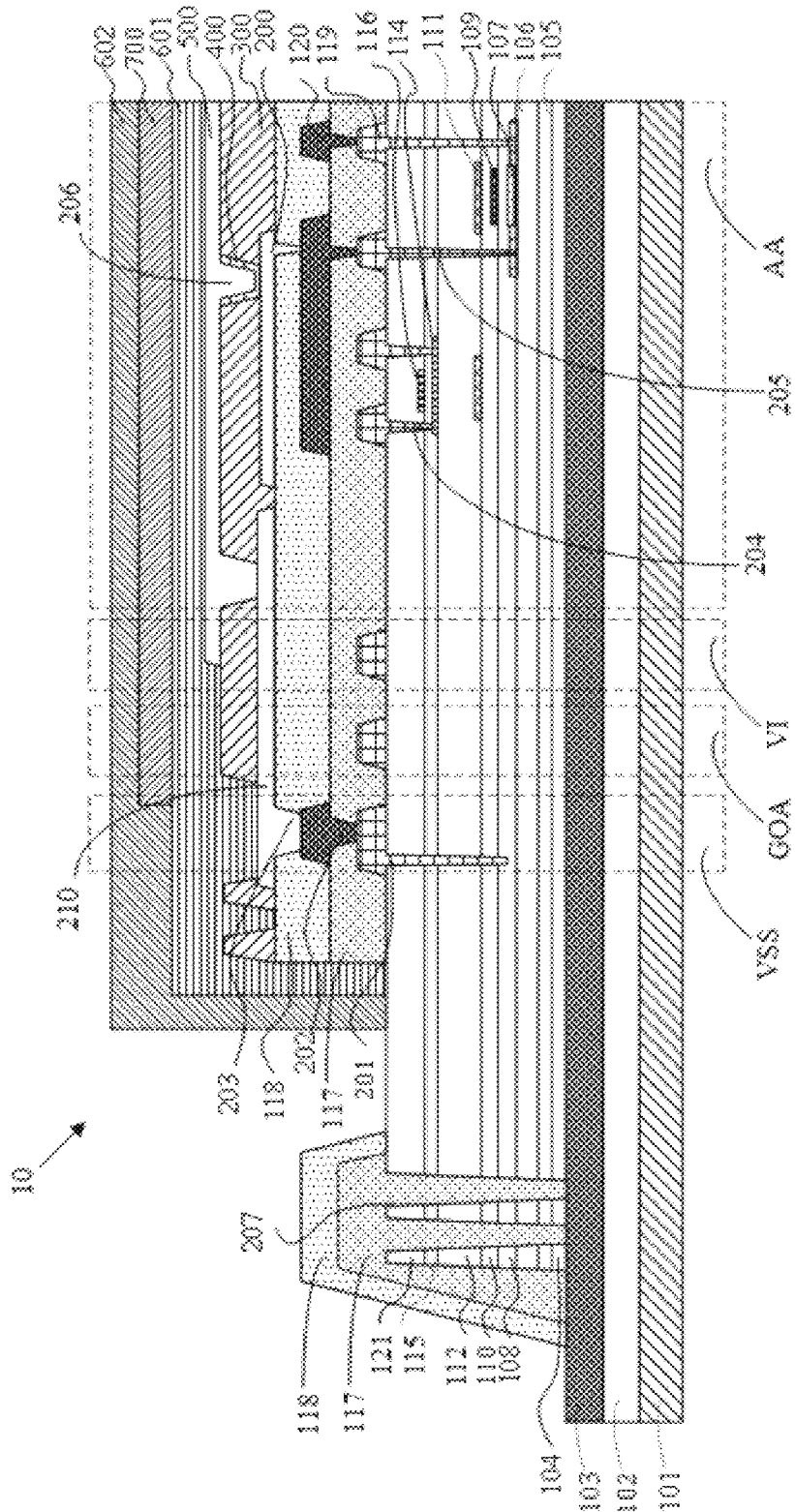
FIG. 9 is an eighth schematic diagram of the display device of the present application.

In one embodiment, as illustrated in FIG. 9, the first groove 201 extends from the interlayer insulation layer 121 to the first gate insulation layer 108, which has a better effect of blocking diffusion of moisture, hydrogen, oxygen, etc. from the direction of the substrate to the second semiconductor layer 114 than the structures of FIG. 6 to FIG. 8.

In addition to the aforesaid first groove 201 and second groove 202, as illustrated in FIG. 2 to FIG. 9, a third groove 203, a fourth groove 204, a fifth groove 205, a sixth groove 206, and seventh grooves 207 are further defined in the display device 10.

In one embodiment, the plurality of third grooves 203 are defined in the second planarization layer 118, the anode 200 is disposed on the planarization layer, is filled in the third grooves 203, and is connected to the second metal layer.

In one embodiment, the fourth groove 204 extends from the interlayer insulation layer 121 to the second semiconductor layer 114, and the first metal layer is filled in the fourth groove 204 and is connected to the second semiconductor layer 114.

In one embodiment, the fifth groove 205 extends from the interlayer insulation layer 121 to the first semiconductor layer 107, and the first metal layer is filled in the fifth groove 205 and is connected to the first semiconductor layer 107.

In one embodiment, the sixth groove 206 is defined in the pixel definition layer 300, the light-emitting layer 400 is filled in the sixth groove 206, and the cathode 500 covers the light-emitting layer 400.

In one embodiment, the seventh groove 207 extends from the interlayer insulation layer 121 to the second substrate layer 103, and a part of the first planarization layer 117 is filled in the seventh groove 207 to block water vapor, oxygen, etc. invading into the display device 10.

Figure 12:
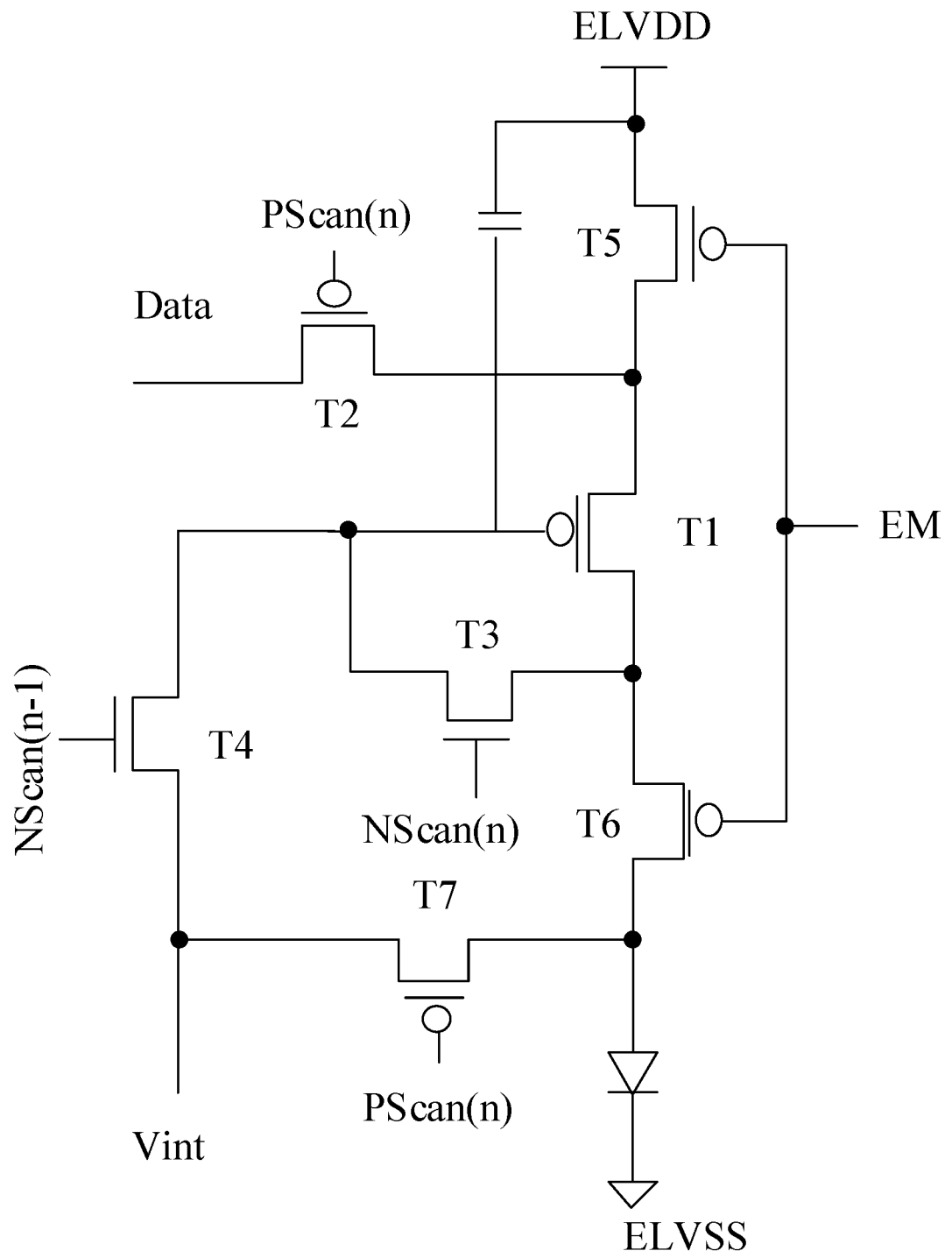
FIG. 12 is a circuit diagram of the display device of the present application.

In one embodiment, as illustrated in FIG. 12, the display device 10 of the present application includes a circuit composed of 7 thin film transistors and 1 capacitor (7T1C)

The thin film transistor having the second semiconductor layer 114 can be the thin film transistor T3 or the thin film transistor T4 in FIG. 12, and the thin film transistor having the first semiconductor layer 107 can be the thin film transistor except the thin film transistor T3 or the thin film transistor T4 in FIG. 12.

Therefore, in summary, in the present application, the source/drain layer extending to a substrate is used to reduce influence of water and oxygen of environment on the metal oxide device of the thin film transistor, and to prevent moisture and oxygen in the environment from diffusing into the display device, especially can prevent the active layer from being affected by moisture, oxygen, etc., thereby improving stability of the display device.

Although the present application has been shown and described with respect to one or more implementations, equivalent alterations and modifications will occur to others skilled in the art based upon a reading and understanding of this specification and the annexed drawings. The present application includes all such modifications and alterations, and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the present application. In addition, while a particular feature of the present application may have been disclosed with respect to only one of several implementations, such features may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

Which mentioned above is preferred embodiments of the present application, it should be noted that to those skilled in the art without departing from the technical theory of the present application, can further make many changes and modifications, and the changes and the modifications should be considered as the scope of protection of the present application.

What is claimed is:

1. A display device, wherein a display region and a non-display region are defined on the display device and comprises:
   a substrate;
   a non-organic insulation layer disposed on a side of the substrate; wherein a first groove is defined in the non-organic insulation layer corresponding to the non-display region, an opening of the first groove is away from the substrate, and a metal retaining wall is disposed in the first groove;
   a light-emitting layer disposed on a side of the non-organic insulation layer away from the substrate; and
   an encapsulation layer disposed on a side of the light-emitting layer away from the substrate and extending from the display region to the non-display region,
   wherein the encapsulation layer is overlapped with the first groove in the non-display region, and a first gap is between an edge of the encapsulation layer and an edge of the non-organic insulation layer;

wherein the non-display region comprises a first wiring region provided with a low level line, the first groove is located within the first wiring region, and the metal retaining wall is electrically connected to the low level line;

wherein the display device further comprises a dam disposed on the non-organic insulation layer and located at the edge of the non-organic insulation layer, and the dam is separated from the encapsulation Layer;

wherein the first groove is defined in an annular shape around the display region, and an orthographic projection of the metal retaining wall in a plane perpendicular to a direction extending from the display region to the non-display region entirely overlaps an orthographic projection of each of two side surfaces of the first groove in the direction extending from the display region to the non-display region in the plane; and wherein the display device comprises a first metal layer disposed on the side of the non-organic insulation layer away from the substrate, the first metal layer comprises a plurality of peripheral wirings disposed in the non-display region, and the metal retaining wall disposed in the first groove is electrically connected to at least one of the peripheral wirings.

2. The display device as claimed in claim 1, wherein the metal retaining wall in the first groove is electrically connected to the peripheral wiring farthest from the display region.

3. The display device as claimed in claim 1, wherein the display device comprises a driving circuit layer comprising a plurality of transistors disposed in the non-organic insulation layer, the first metal layer comprises source/drain wirings disposed in the display region, and the source/drain wirings are electrically connected to corresponding ones of the plurality of transistors.

4. The display device as claimed in claim 3, wherein the driving circuit layer comprises:
a first semiconductor layer;
a first gate electrode layer disposed on the first semiconductor layer away from the substrate;
a second gate electrode layer disposed on a side of the first gate electrode layer away from the substrate;
a second semiconductor layer disposed on a side of the second gate electrode layer away from the substrate;
a third gate electrode disposed on a side of the second semiconductor layer away from the substrate;
a source/drain layer disposed on a side of the second gate electrode layer away from the substrate and is electrically connected to the first semiconductor layer and the second semiconductor layer respectively;
the non-organic insulation layer comprises:
a buffer layer disposed on the side of the substrate, wherein the first semiconductor layer is disposed on a side of the buffer layer away from the substrate;
a first gate insulation layer disposed between the first semiconductor layer and the first gate electrode layer;
a second gate insulation layer disposed between the first gate electrode layer and the second gate electrode layer;
a third gate insulation layer disposed between the second gate electrode layer and the second semiconductor layer;
a fourth gate insulation layer disposed between the second semiconductor layer and the third gate electrode layer; and
an interlayer insulation layer disposed between the third gate electrode layer and the source/drain layer, wherein the first groove extends from the interlayer insulation layer to the second gate insulation layer.

5. The display device as claimed in claim 4, wherein the third gate insulation layer comprises a first interlayer insulation film layer and a second interlayer insulation film layer, the first interlayer insulation film layer is disposed on the second gate insulation layer, and the second interlayer insulation film layer is disposed between the first interlayer insulation film layer and the fourth gate insulation layer.

6. The display device as claimed in claim 4, wherein the display device comprises:
a planarization layer disposed on a side of the first metal layer away from the substrate, wherein the planarization layer is disposed in the display region and extends to the non-display region, a second gap is between an edge of the planarization layer and the edge of the non-organic insulation layer, and the second gap is greater than the first gap.

7. The display device as claimed in claim 6, wherein the display device comprises:
a second metal layer disposed on a side of the planarization layer away from the substrate,
wherein the second metal layer comprises an anode disposed in the display region and a bridge wiring disposed in the non-display region,
and the bridge wiring is electrically connected to the metal retaining wall.

8. The display device as claimed in claim 7, wherein the display device comprises:
a cathode disposed on the side of the light-emitting layer away from the substrate, wherein the cathode is electrically connected to the bridge wiring in the non-display region.

9. The display device as claimed in claim 6, wherein the planarization layer comprises a first planarization layer and a second planarization layer,
the first planarization layer is disposed on the non-organic insulation layer, and
the second planarization layer is disposed on the first planarization layer.

10. The display device as claimed in claim 9, wherein a second groove is defined in the non-display region and is located in the first planarization layer, and a part of the second metal layer is filled in the second groove and is connected to the first metal layer.

11. The display device as claimed in claim 9, wherein a plurality of third grooves are defined in the second planarization layer, and the anode is disposed on the planarization layer, is filled in the third grooves, and is connected to the second metal layer.

12. The display device as claimed in claim 4, wherein a fourth groove extends from the interlayer insulation layer to the second semiconductor layer, and the first metal layer is filled in the fourth groove and is connected to the second semiconductor layer.

13. The display device as claimed in claim 7, wherein the display device comprises a pixel definition layer, and the pixel definition layer is disposed on the anode.

14. The display device as claimed in claim 13, wherein a fifth groove extends from the interlayer insulation layer to the first semiconductor layer, and the first metal layer is filled in the fifth groove, a sixth groove is defined in the pixel definition layer, the light-emitting layer is filled in the sixth groove, and the cathode covers the light-emitting layer.

15. The display device as claimed in claim 4, wherein the substrate comprises a first substrate layer, a first barrier layer, a second substrate layer, and a second barrier layer, the first barrier layer is disposed on the first substrate layer, the second substrate layer is disposed on the first barrier layer, and the second barrier layer is disposed on the second substrate layer.

16. The display device as claimed in claim 15, wherein a seventh groove extends from the interlayer insulation layer to the second substrate layer, and a part of the first planarization layer is filled in the seventh groove.

17. The display device as claimed in claim 1, wherein the first metal layer comprises a first source/drain layer and a second source/drain layer, and the second source/drain layer is disposed on the first source/drain layer and is electrically connected to the first source/drain layer.

18. The display device as claimed in claim 17, wherein the first source/drain layer and the second source/drain layer comprise a plurality of source/drain film layers.

\* \* \* \* \*